(12) United States Patent
Florescu et al.

(10) Patent No.: US 7,323,944 B2
(45) Date of Patent: Jan. 29, 2008

(54) PLL LOCK MANAGEMENT SYSTEM

(75) Inventors: Octavian Florescu, Berkeley, CA (US); Amr M. Fahim, Newport Beach, CA (US); Chiewcharn Narathong, Laguna Niguel, CA (US)

(73) Assignee: Qualcomm Incorporated, San Diego, CA (US)

(*) Notice: Subject to any disclaimer, the term of this patent is extended or adjusted under 35 U.S.C. 154(b) by 67 days.

(21) Appl. No.: 11/103,743

(22) Filed: Apr. 11, 2005

(65) Prior Publication Data

US 2006/0226916 A1 Oct. 12, 2006

(51) Int. Cl.
*H03L 7/06* (2006.01)
*H03L 7/10* (2006.01)

(52) U.S. Cl. .......................... 331/14; 331/17; 455/260

(58) Field of Classification Search ................ 331/1 A, 331/8, 14, 16–18, 25, DIG. 2; 327/156–159; 332/127; 360/51; 375/376; 455/260
See application file for complete search history.

(56) References Cited

U.S. PATENT DOCUMENTS 6,680,653 B2 * 1/2004 Griffith et al. ................ 331/17

| | | |
|---|---|---|
| 2003/0171105 A1 | 9/2003 | Dunworth et al. |
| 2003/0197564 A1 | 10/2003 | Humphreys et al. |
| 2004/0061559 A1 | 4/2004 | Charlon |

* cited by examiner

*Primary Examiner*—David Mis
(74) *Attorney, Agent, or Firm*—Kenyon Jenckes; Larry J. Moskowitz; Thomas Rouse

(57) ABSTRACT

A PLL includes a charge pump, a loop filter, a VCO, and a calibration unit. The calibration unit performs coarse tuning to select one or multiple frequency ranges, performs fine tuning to determine an initial control voltage that puts the VCO near a desired operating frequency, measures the VCO gain at different control voltages, and derives VCO gain compensation values for the different control voltages. The calibration unit also pre-charges the loop filter to the initial control voltage to shorten acquisition time, enables the loop filter to drive the VCO to lock to the desired operating frequency, and performs VCO gain compensation during normal operation. For VCO gain compensation, the calibration unit measures the control voltage, obtains the VCO gain compensation value for the measured control voltage, and adjusts the gain of at least one circuit block (e.g., the charge pump) to account for variation in the VCO gain.

29 Claims, 11 Drawing Sheets

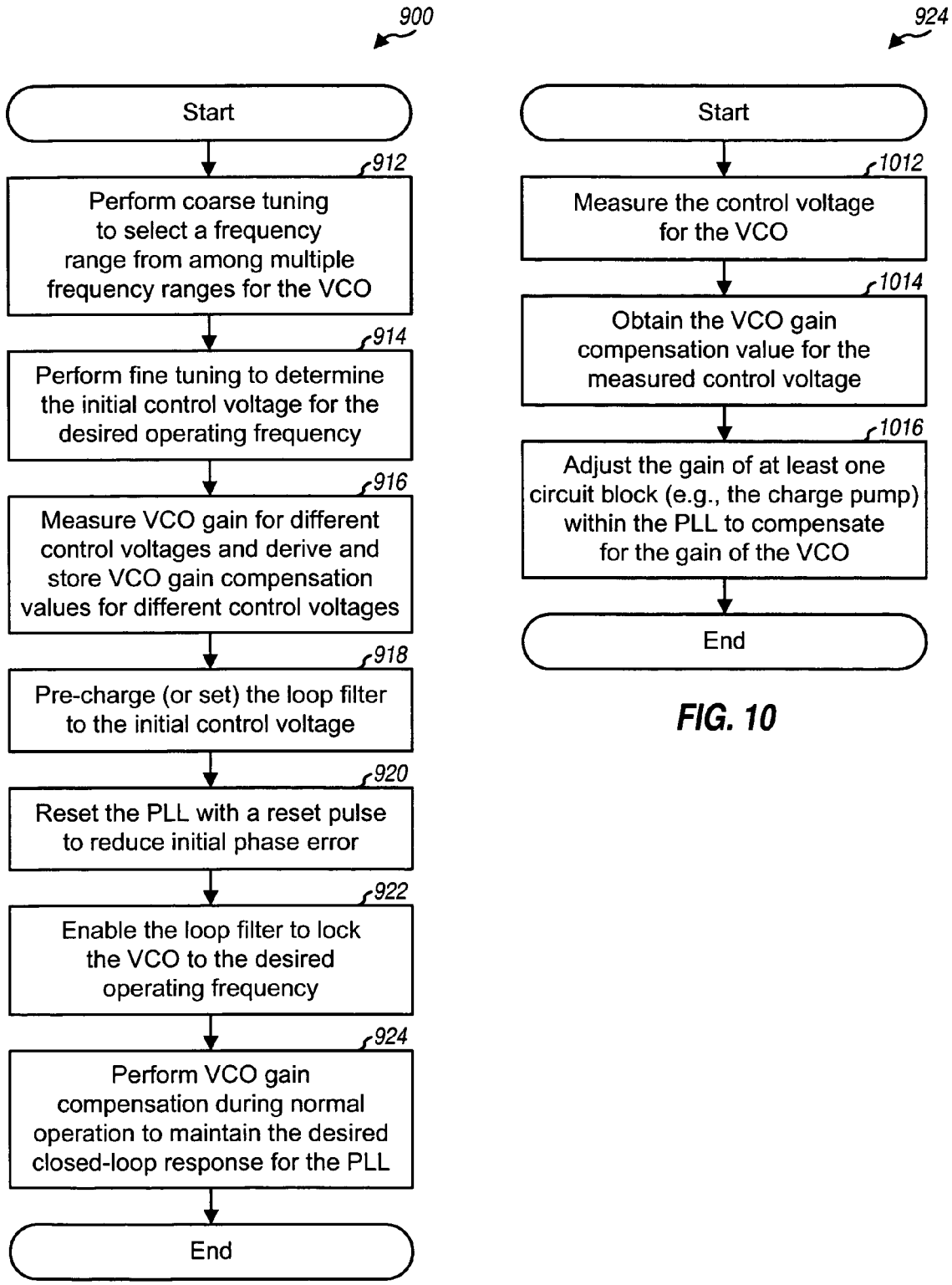

PLL LOCK MANAGEMENT SYSTEM

BACKGROUND

I. Field

The present invention relates generally to electronics circuits, and more specifically to a phase-locked loop.

II. Background

A phase-locked loop (PLL) is a circuit that receives a reference signal having a reference frequency and generates an output signal having an output frequency that is related to the reference frequency. A PLL is often used when an accurate output frequency is needed. The reference frequency is typically a precise frequency. The output frequency has similar accuracy as the reference frequency but may be many times higher than the reference frequency.

A PLL typically includes a voltage controlled oscillator (VCO) that generates a VCO signal, a loop filter that generates a control voltage for the VCO, and other supporting circuit blocks. The operation of the PLL may be divided into two parts —an acquisition phase and a tracking phase. In the acquisition phase, the PLL attempts to lock the frequency of the VCO signal to the frequency of the reference signal. In the tracking phase, which commences after successfully completing acquisition, the PLL adjusts the frequency/phase of the VCO signal to track variations in the frequency/phase of the reference signal.

The performance of the acquisition and tracking phases is determined by various factors including the characteristics of the VCO and loop filter. When the PLL is first powered up, the control voltage from the loop filter typically starts at a voltage rail, and there may be a large initial frequency error between the VCO signal and the reference signal. The feedback mechanism of the PLL may be relied upon to adjust the control voltage to lock the VCO frequency to the reference frequency. However, if the VCO has a wide frequency range and/or if the closed-loop bandwidth of the PLL is small relative to the initial frequency error, then acquisition may take a long time or may never be achieved.

There is therefore a need in the art for techniques to quickly and reliably lock a VCO to a reference signal.

SUMMARY

A PLL with a wide overall frequency range of operation, fast acquisition time, and good dynamic performance is described herein. In an embodiment, the PLL includes a charge pump, a loop filter, a VCO, and a calibration unit. The VCO may be operated at any one of multiple frequency ranges, which may be obtained with a bank of programmable capacitors. The VCO also has a tuning range for the selected frequency range. This tuning range is the range of VCO frequencies achieved by varying the control voltage for a varactor within the VCO over the entire voltage range for the varactor.

The calibration unit performs a number of tasks for calibration and normal operation of the PLL. In an embodiment, for calibration, the calibration unit (1) performs coarse tuning to select the frequency range that covers a desired operating frequency, (2) performs fine tuning to determine an initial control voltage that puts the VCO near the desired operating frequency, (3) measures the gain of the VCO at different control voltages, and (4) derives VCO gain compensation values for the different control voltages. The calibration unit may perform a binary search across M code bits to find the proper frequency range and may perform another binary search across L DAC bits to find the initial control voltage. The calibration tasks are described in detail below.

In an embodiment, for normal operation of the PLL, the calibration unit (1) pre-charges the loop filter to the initial control voltage, e.g., while the VCO gain is being measured during the coarse tuning and fine tuning, (2) resets the PLL with a reset pulse to reduce initial phase error, (3) enables the loop filter to drive the VCO to acquire the desired operating frequency, and (4) performs VCO gain compensation during normal operation. The pre-charging of the loop filter reduces the initial frequency error and shortens the amount of time needed for acquisition. The VCO gain compensation may be performed by measuring the control voltage, e.g., with an analog-to-digital converter (ADC), obtaining the VCO gain compensation value for the measured control voltage, and varying the gain of at least one circuit block (e.g., the charge pump) within the PLL to account for the gain of the VCO. By maintaining an approximately constant overall gain, the closed-loop characteristics of the PLL is maintained constant even if the control voltage and hence the VCO gain changes, e.g., due to temperature and/or power supply variations.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

FIG. 9 shows a process for calibrating and operating the PLL.

FIG. 10 shows a process for performing VCO gain compensation during normal operation of the PLL.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The PLL described herein may be used for various electronics circuits including communication circuits. For example, the PLL may be used in (1) a transmitter subsystem to generate a local oscillator (LO) signal used for frequency upconversion, (2) a receiver subsystem to generate an LO signal used for frequency downconversion, (3) a digital subsystem to generate clock signals used for synchronous circuits such as flip-flops and latches, and (4) other circuits and subsystems. For clarity, a PLL for a wireless communication device is described below.

Figure 1:
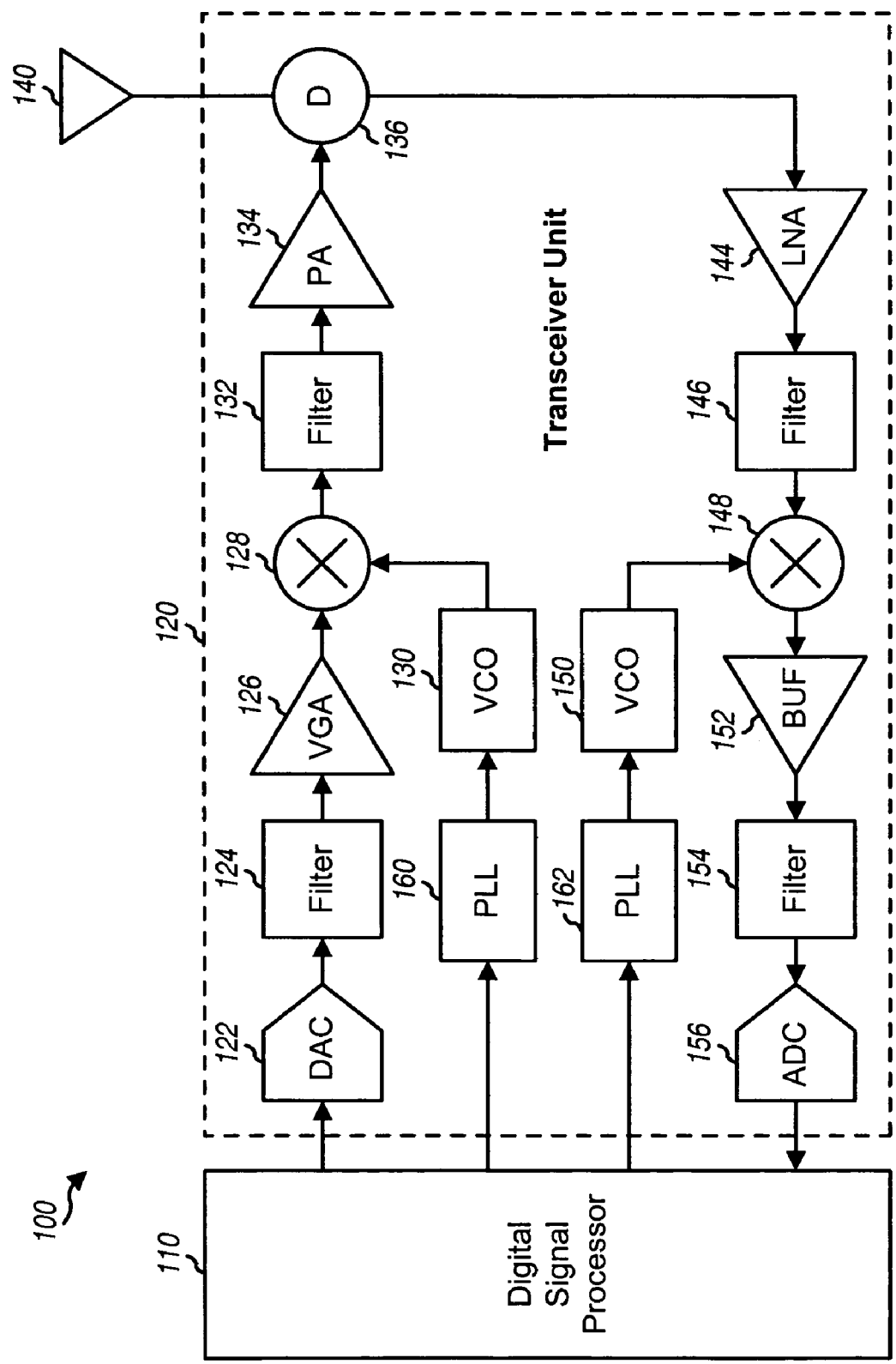
FIG. 1 shows a block diagram of a wireless communication device.

FIG. 1 shows a block diagram of a wireless communication device 100 that may be used for communication with a wireless communication system. Wireless device 100 may be a cellular phone, a user terminal, a handset, a subscriber unit, or some other device or apparatus. Wireless device 100 is capable of providing bi-directional communication via a transmit path and a receive path.

On the transmit path, a digital signal processor (DSP) 110 processes traffic data and provides a stream of chips to a transceiver unit 120. Within transceiver unit 120, one or more digital-to-analog converters (DACs) 122 convert the stream of chips to one or more analog signals. The analog signal(s) are filtered by a filter 124, amplified by a variable gain amplifier (VGA) 126, and frequency upconverted from baseband to radio frequency (RF) by a mixer 128. The frequency upconversion is performed with an upconversion LO signal from a VCO 130. The upconverted signal from mixer 128 is filtered by a filter 132, amplified by a power amplifier (PA) 134, routed through a duplexer (D) 136, and transmitted from an antenna 140.

On the receive path, signals transmitted by base stations in the system are received by antenna 140, routed through duplexer 136, amplified by a low noise amplifier (LNA) 144, filtered by a filter 146, and frequency downconverted from RF to baseband by a mixer 148 with a downconversion LO signal from a VCO 150. The downconverted signal from mixer 148 is buffered by a buffer 152, filtered by a filter 154, and digitized by one or more analog-to-digital converters (ADCs) 156 to obtain one or more streams of samples. The sample stream(s) are provided to DSP 110 for processing.

FIG. 1 shows a specific transceiver design. In a typical transceiver, the signal conditioning for each path may be performed by one or more stages of amplifier, filter, mixer, and so on. FIG. 1 also shows a direct conversion architecture whereby signals are converted directly between RF and baseband. The frequency conversion may also be performed in multiple stages with a super-heterodyne architecture, e.g., between baseband and intermediate frequency (IF) in one stage, and between IF and RF in another stage. The transmit and receive paths may thus include different and/or additional circuit blocks not shown in FIG. 1.

For the embodiment shown in FIG. 1, transceiver unit 120 includes two VCOs 130 and 150 for the transmit and receive paths, respectively. A PLL unit 160 receives control information from DSP 110 and provides a control for VCO 130 to generate the proper upconversion LO signal. A PLL unit 162 receives control information from DSP 110 and provides a control for VCO 150 to generate the proper downconversion LO signal. For clarity, VCOs 130 and 150 are shown separate from PLLs 160 and 162 in FIG. 1. VCOs 130 and 150 may also be viewed as being part of PLLs 160 and 162, respectively.

Each VCO may be designed to cover a specific frequency band or multiple frequency bands. Some frequency bands commonly used for wireless communication include a Personal Communication System (PCS) band from 1850 to 1990 MHz, a cellular band from 824 to 894 MHz, a Digital Cellular System (DCS) band from 1710 to 1880 MHz, a GSM900 band from 890 to 960 MHz, an International Mobile Telecommunications-2000 (IMT-2000) band from 1920 to 2170 MHz, and a Global Positioning System (GPS) band from 1574.4 to 1576.4 MHz. Each VCO may be designed to operate at any integer or non-integer multiple of one or more frequency bands supported by the wireless device.

Figure 2:
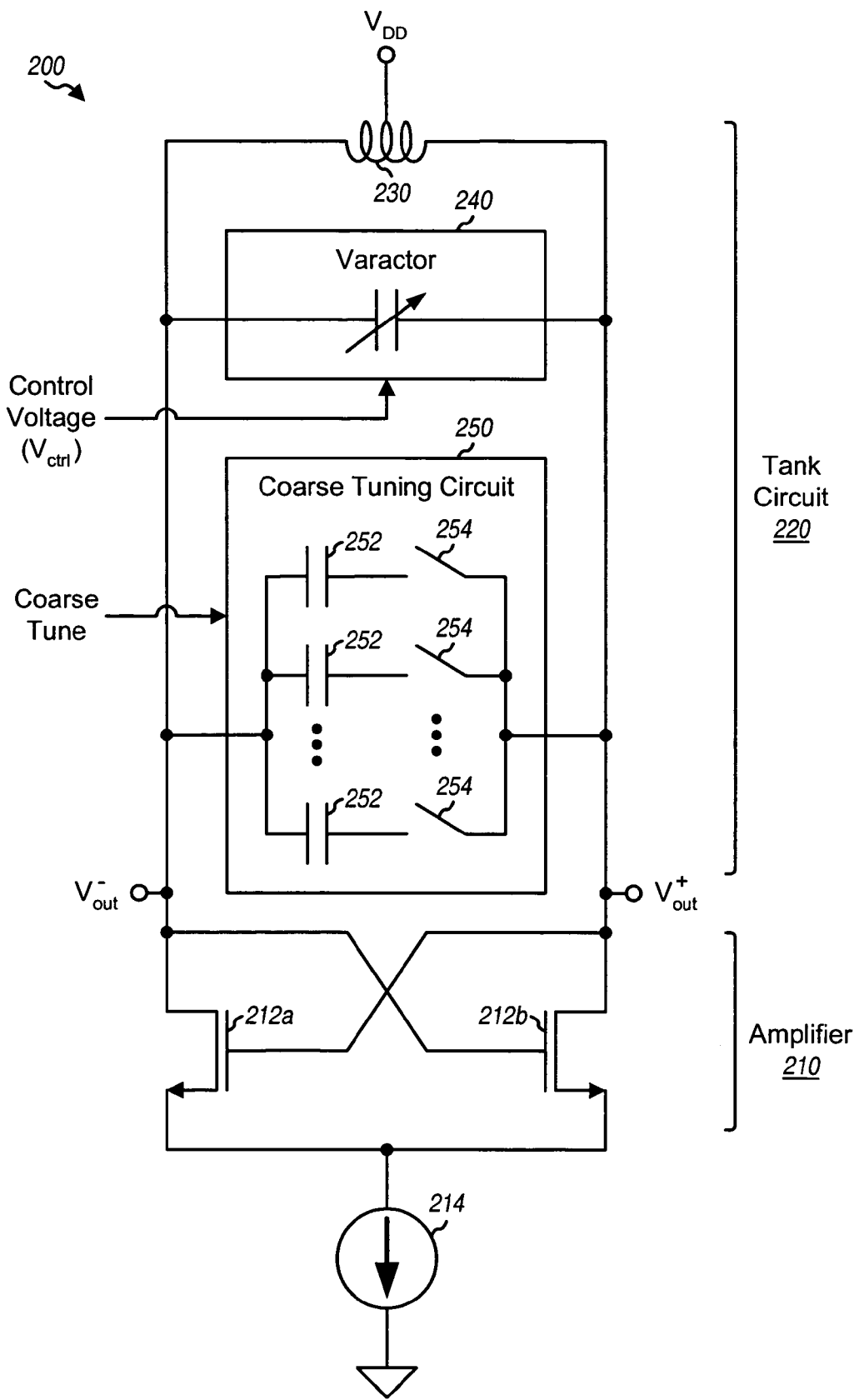
FIG. 2 shows a schematic diagram of a VCO.

FIG. 2 shows a schematic diagram of an embodiment of a VCO 200, which may be used for VCO 130 and/or VCO 150 in FIG. 1. VCO 200 includes an amplifier 210, a current source 214, and a tank circuit 220. Amplifier 210 is formed by two N-channel field effect transistors (N-FETs) 212a and 212b that are cross-coupled such that the output of one N-FET couples to the input of the other N-FET. Current source 214 couples to the sources of N-FETs 212a and 212b and provides the bias current for these N-FETs. Tank circuit 220 includes an inductor 230, a variable capacitor (varactor) 240, and a coarse tuning circuit 250, all of which couple in parallel and between the output nodes $V_{out}^+$ and $V_{out}^-$. Coarse tuning circuit 250 is also called a programmable capacitor bank or a switchable capacitor bank. Varactor 240 receives a control voltage $V_{ctrl}$ that adjusts the capacitance of the varactor. Coarse tuning circuit 250 includes a bank of capacitors 252 and their associated switches 254. Each capacitor 252 may be selectively enabled or disabled from VCO 200 by turning on or off the associated switch 254 via a digital control, which is labeled as Coarse Tune in FIG. 2.

The inductance and capacitance of tank circuit 220 determine the frequency of oscillation for VCO 200. Each capacitor 252 that is enabled increases the capacitance of tank circuit 220, which then lowers the VCO frequency. Capacitors 252 in coarse tuning circuit 250 may be implemented with thermometer decoding or binary decoding. With thermometer decoding, all of the capacitors have the same capacitance, e.g., unit capacitance of $C_T$. With binary decoding, the capacitors have progressively larger capacitance that doubles in size, e.g., $C_T$, $2C_T$, $4C_T$, and so on. An M-bit coarse tuning circuit 250 may provide $2^M$ different capacitance values of 0, $C_T$, $2C_T$, $3C_T$, ..., $(2^M-1) \cdot C_T$. In general, M may be any integer value, e.g., M=3, 4, 5, and so on. Each capacitance value may be obtained by enabling the proper combination of capacitors 252 and disabling the remaining capacitors. For VCO 200, $2^M$ different VCO frequencies may be obtained with the $2^M$ different capacitance values provided by coarse tuning circuit 250. Each capacitance value is defined by a specific coarse tune code, and there are $2^M$ coarse tune codes for the $2^M$ different capacitance values.

For each of the $2^M$ coarse tune codes, a range of frequencies (which is often called a tuning range) is obtained for VCO 200 by adjusting the control voltage for varactor 240 over its entire voltage range. $2^M$ different frequency ranges may be obtained for the $2^M$ coarse tune codes. The frequency ranges for adjacent coarse tune codes overlap one another by design. The $2^M$ frequency ranges form the overall frequency range for VCO 200 and cover one or more frequency bands of interest. Coarse tuning circuit 250 is thus used to extend the range of frequencies for VCO 200. Coarse tuning circuit 250 may be controlled such that VCO 200 can operate at any frequency within the overall frequency span.

For VCO 200, which has both varactor 240 and coarse tuning circuit 250, the coarse tuning circuit is used to select the frequency range that covers the desired operating frequency, and the varactor is used to adjust the VCO to the desired operating frequency. VCO 200 is designed such that the tuning range for varactor 240 is larger than the difference in frequencies for any two adjacent coarse tune codes. The tuning range is used to compensate for changes in the VCO frequency due to variations in temperature, power supply, and so on.

Figure 3:
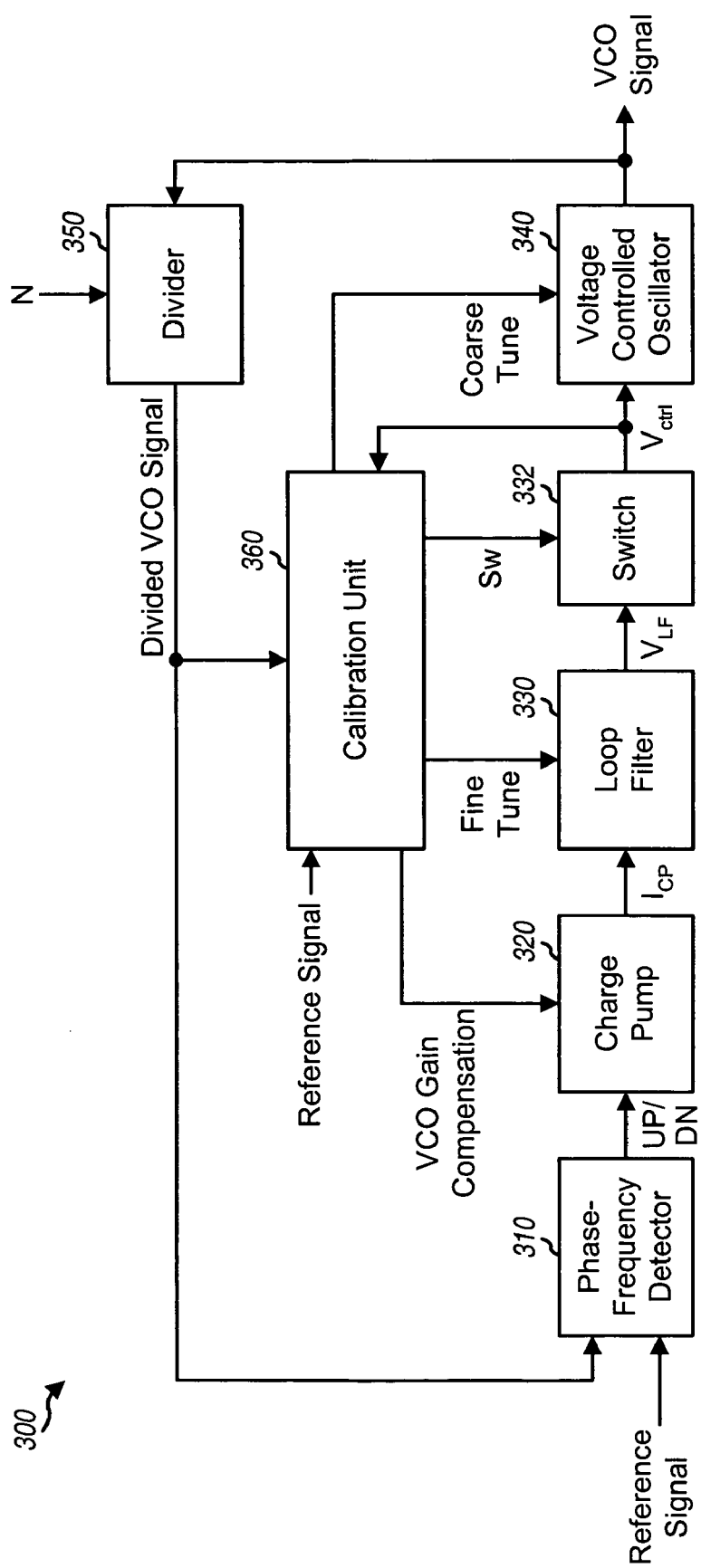
FIG. 3 shows a block diagram of a PLL.

FIG. 3 shows a block diagram of an embodiment of a PLL 300, which may be used for the transmit path and/or the receive path in FIG. 1. PLL 300 includes a phase-frequency detector 310, a charge pump 320, a loop filter 330, a switch 332, a VCO 340, a divider 350, and a calibration unit 360. VCO 340 may be implemented with VCO 200 in FIG. 2 and may include (1) a varactor for fine frequency tuning and frequency acquisition and tracking and (2) a bank of programmable capacitors for coarse frequency tuning.

VCO 340 generates a VCO signal having a frequency of $f_{vco}$. Divider 350 divides the VCO signal in frequency by a factor of N and provides a divided VCO signal having a frequency of $f_{div}$. In general, N may be any integer or non-integer value equal to or greater than one. Phase-frequency detector 310 receives a reference signal and the divided VCO signal, compares the phases of the two signals, and provides an UP or DN signal to indicate whether the reference signal is early or late with respect to the divided VCO signal. The reference signal has a frequency of $f_{ref}$ and is typically generated by (or derived from) an accurate oscillator such as a voltage controlled crystal oscillator (VCXO), a temperate compensated crystal oscillator (TCXO), and so on.

Charge pump 320 receives the UP/DN signal from detector 310 and a VCO gain compensation control from calibration unit 360. Charge pump 320 generates an output current $I_{CP}$ that is (1) proportional to the detected phase difference between the reference signal and the divided VCO signal and (2) dependent on the VCO gain compensation control. Loop filter 330 receives the $I_{CP}$ current from charge pump 320 and a fine tune control from calibration unit 360. Loop filter 330 is pre-charged by the fine tune control to speed up acquisition, as described below. During normal operation, loop filter 330 filters the $I_{CP}$ current and generates a control voltage $V_{ctrl}$ for VCO 340. Loop filter 330 adjusts the $V_{ctrl}$ voltage such that the phase/frequency of the divided VCO signal is locked to the phase/frequency of the reference signal. Switch 332 passes the $V_{ctrl}$ voltage to VCO 340 when enabled during normal operation. VCO 340 receives the $V_{ctrl}$ voltage via switch 332 and a coarse tune control from calibration unit 360 and generates the VCO signal having the $f_{vco}$ frequency, which is determined by the two inputs.

In an embodiment, calibration unit 360 performs the following tasks:
1. Perform coarse tuning to set the coarse tuning circuit such that the VCO operates at the desired frequency;
2. Perform fine tuning to determine an initial control voltage for the VCO;
3. Measure the gain of the VCO, KV, which is given in units of MHz/Volts;
4. Provide the initial control voltage to the VCO to speed up acquisition;
5. Minimizes the initial phase error when the PLL begins locking with a reset pulse synchronized to the TCXO;
6. Perform VCO gain compensation to maintain the desired closed-loop characteristics for the PLL.

Tasks 1, 2 and 3 are performed for calibration, tasks 4 and 5 are performed for locking, and task 6 is performed during locking and for normal PLL operation. Each of these tasks is described in detail below.

Figure 4A:
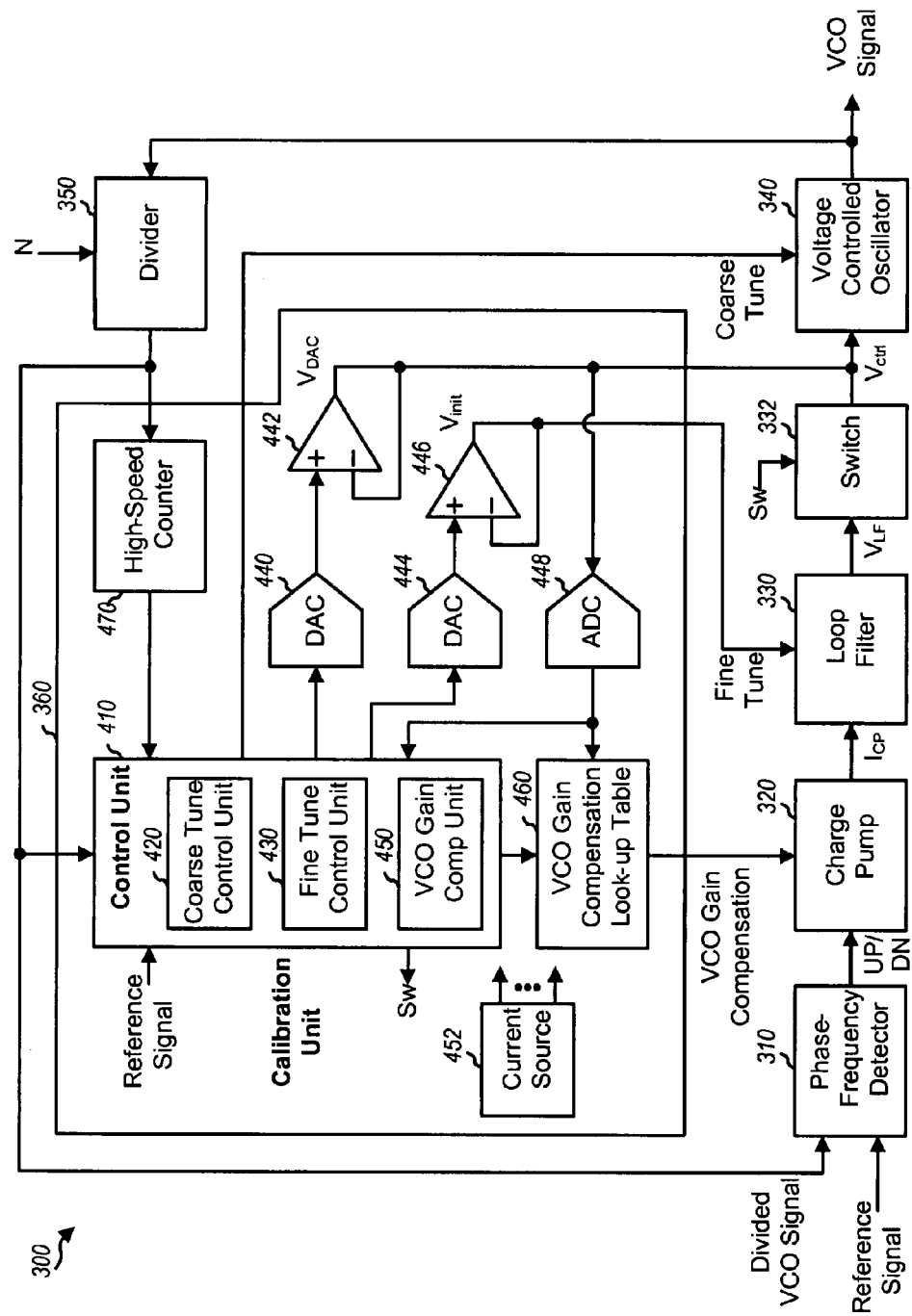
FIG. 4A and 4B show block diagrams of a calibration unit for the PLL.
Figure 4B:
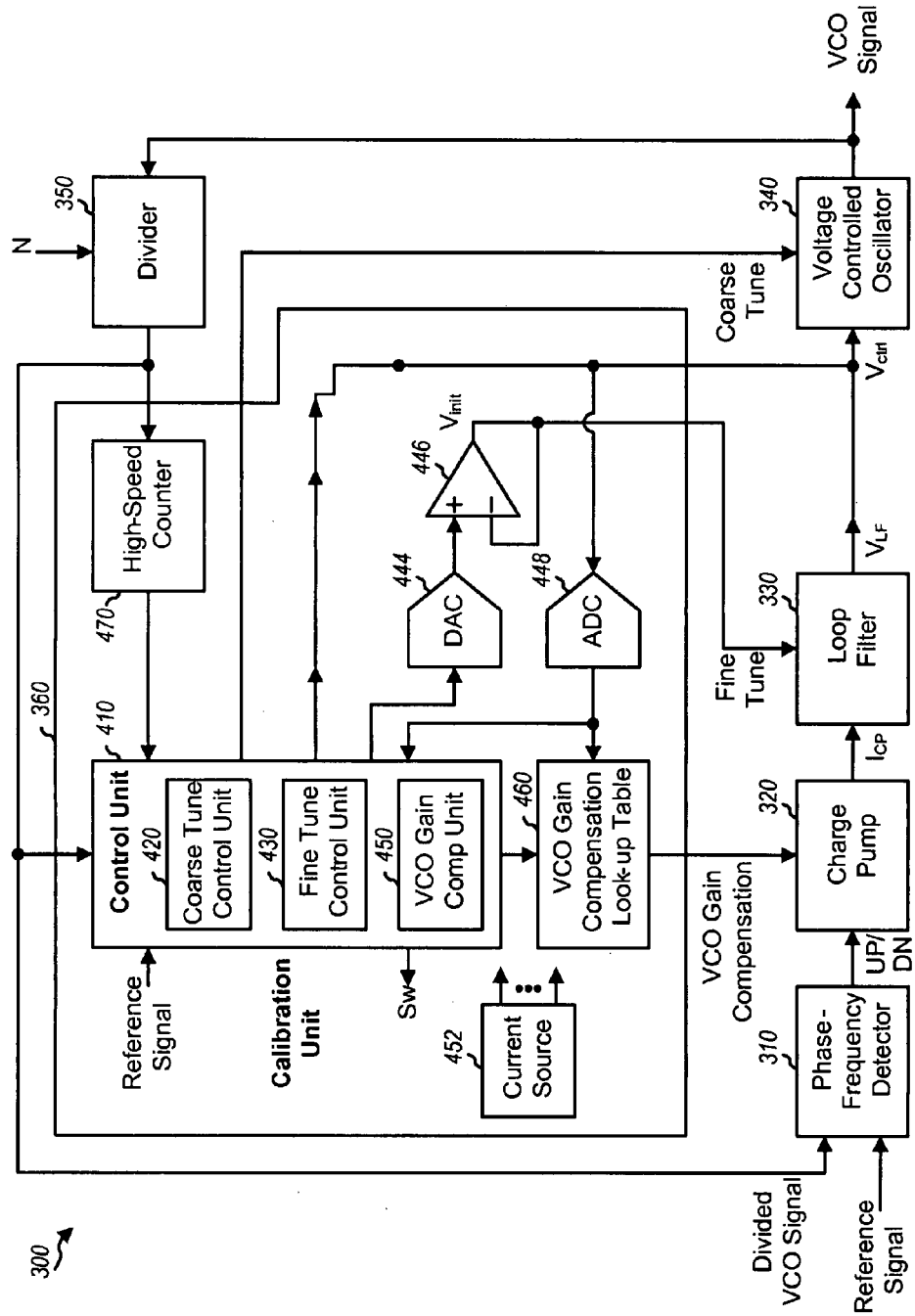

FIG. 4 shows a block diagram of an embodiment of calibration unit 360 for PLL 300. For this embodiment, calibration unit 360 includes a control unit 410, DACs 440 and 444, unity gain buffers 442 and 446, an ADC 448, a reference current source 452, a look-up table 460, and a high-speed counter 470.

Control unit 410 includes (1) a coarse tune control unit 420 that supervises the coarse tuning of VCO 340, (2) a fine tune control unit 430 that supervises the fine tuning of VCO 340, and (3) a VCO gain compensation (comp) unit 450 that supervises the measurement and compensation of the VCO gain. Current source 452 provides a reference current $I_{ref}$ used by DACs 440 and 444, ADC 448, and possibly other circuit blocks. DAC 440 receives an L-bit DAC value from control unit 410 and generates a corresponding analog output, which is buffered by buffer 442 to generate a $V_{DAC}$ voltage for VCO 340. DAC 444 also receives an L-bit DAC value from control unit 410 and generates a corresponding analog output, which is buffered by buffer 446 to generate a $V_{init}$ voltage for loop filter 330. DAC 440 is used for coarse and fine tuning, and DAC 444 is used to pre-charge loop filter 330. In general, L may be any integer value, e.g., L=3, 4, 5, and so on. ADC 448 receives the $V_{ctrl}$ voltage at the input of VCO 340, digitizes this voltage, and provides a digital value to look-up table 460. Look-up table 460 is loaded with VCO gain compensation values by control unit 410 during calibration. During normal operation, look-up table 460 receives the digital value from ADC 448 and provides the proper VCO gain compensation value to charge pump 320. The operation of the circuit blocks within calibration unit 360 for the tasks listed above is described below.

Coarse tuning is performed to enable and disable the proper combination of capacitors in the coarse tuning circuit so that VCO 340 can operate at the desired frequency. For an M-bit coarse tuning circuit, each different capacitance value is selected by a specific coarse tune code, and up to $2^M$ different capacitance values may be selected by coarse tune codes of 0 through $2^M-1$. Each coarse tune code indicates a specific combination of zero or more capacitors in the coarse tuning circuit to be switched on/enabled. VCO 340 may operate at different frequencies for a given coarse tune code due to IC process, power supply, temperature, and other factors. To operate VCO 340 at the desired frequency, different coarse tune codes may be required for different VCO operating conditions.

Figure 5:
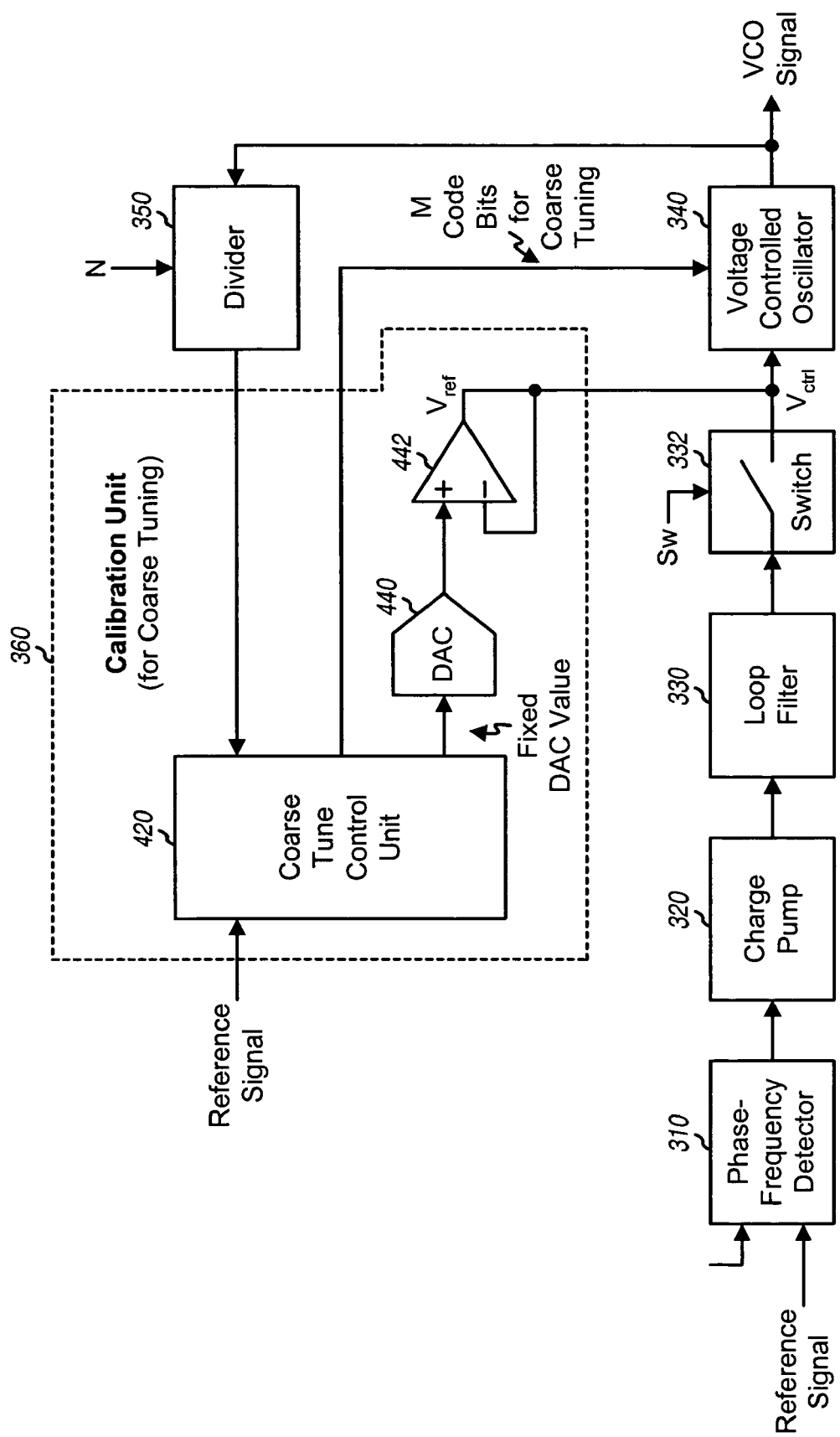
FIG. 5 shows the circuit blocks used for coarse tuning.

FIG. 5 shows a block diagram of the circuit blocks within calibration unit 360 that are used for coarse tuning. Initially, divider 350 is programmed with the proper N divider value, which is determined based on the desired VCO frequency $f_{vco}$ and the reference frequency $f_{ref}$, as follows:

$$N = \frac{f_{vco}}{f_{ref}}. \qquad \text{Eq (1)}$$

Divider 350 may be implemented with a multi-modulus divider (which is also called a fractional divider) if N is not an integer value. For coarse tuning, coarse tune control unit 420 opens switch 332 so that loop filter 330 does not drive VCO 340.

Coarse tune control unit 420 provides a DAC value to DAC 440 to generate a reference voltage $V_{ref}$, which is buffered by buffer 442 and provided to VCO 340. The $V_{ref}$ voltage is fixed for the entire duration of the coarse tuning and serves as a reference point for VCO 340 while the capacitors in the coarse tuning circuit are toggled. The $V_{ref}$ voltage may be selected such that a final control voltage $V_{final}$, which is the control voltage needed to operate VCO 340 at the desired frequency, is as close as possible to the peak VCO gain. In particular, the $V_{ref}$ voltage may be selected such that the frequency range achieved by VCO 340 for control voltages above the $V_{final}$ voltage is approximately equal to the frequency range achieved for control voltages below the $V_{final}$ voltage. The $V_{ref}$ voltage is typically near the center of the control voltage range for VCO 340 but may be skewed higher or lower depending on the design of the VCO.

The $V_{ref}$ voltage may also be generated to be complementary to absolute temperature (CTAT) so that the effect of temperature may be removed from the coarse tuning. The oscillation frequency of VCO 340 normally drifts over temperature, and the same desired VCO frequency typically requires different control voltages at different temperatures. The coarse tuning may be performed at one temperature extreme (e.g., hot) and the VCO may thereafter be operated at the other temperature extreme (e.g., cold). If temperature compensation is not performed, then the VCO may be centered by the coarse tuning at the one temperature extreme, and may then be skewed during normal operation at the other temperature extreme. The use of a CTAT $V_{ref}$ voltage allows the coarse tuning procedure to take into account drift in the VCO frequency due to temperature, which reduces the amount of skew during normal operation due to temperature change. In general, the $V_{ref}$ voltage may or may not be generated to be CTAT, e.g., depending on the characteristics of the VCO over temperature.

In an embodiment, coarse tune control unit 420 performs a binary search to find the coarse tune code for the desired VCO frequency. For the binary search, which begins after the $V_{ref}$ voltage has been applied to the input of VCO 340, coarse tune control unit 420 initially sets the M code bits for the coarse tune code to an initial value of $2^{M-1}$, or '100 . . . 0', so that the most significant code bit is set to '1' and the (M−1) remaining code bits are each set to '0'. This corresponds to half the tuning capacitance being added in coarse tuning circuit 250. Coarse tune control unit 420 then toggles one code bit at a time, starting with the next most significant code bit. For each code bit x that is toggled to '1', coarse tune control unit 420 receives and compares the $f_{div}$ frequency of the divided VCO signal against the $f_{ref}$ frequency of the reference signal. If the $f_{div}$ frequency is higher than the $f_{ref}$ frequency, then code bit x is kept at the new value of '1', and the next lesser significant code bit is toggled. Otherwise, if the divided frequency is lower than the reference frequency, then code bit x is reset to the original value of '0', and the next lesser significant code bit is toggled to '1'. After all M code bits have been toggled and set/reset as described above, the coarse tune code for the desired VCO frequency is equal to the final values of the M code bits.

The $f_{div}$ frequency may be compared against the $f_{ref}$ frequency by (1) operating a first counter with the divided VCO signal for a given time window, (2) operating a second counter with the reference signal for the same time window, and (3) comparing the count value of the first counter against the count value of the second counter. By comparing the $f_{div}$ frequency against the $f_{ref}$ frequency (instead of their divided down versions), a shorter amount of time is needed for the frequency comparison, and hence a shorter amount of time is needed for the coarse tuning.

The coarse tuning may also be performed in other manners. For example, the PLL may attempt to lock the VCO to the reference signal for each different coarse tune code.

After completing the coarse tuning, fine tuning is performed to determine the initial control voltage $V_{init}$ for VCO 340. The desired VCO frequency is obtained with the final control voltage $V_{final}$ being applied to VCO 340, which is unknown at this point. The initial control voltage is a control voltage that is close to the final control voltage and that may be used to speed up acquisition.

Figure 6:
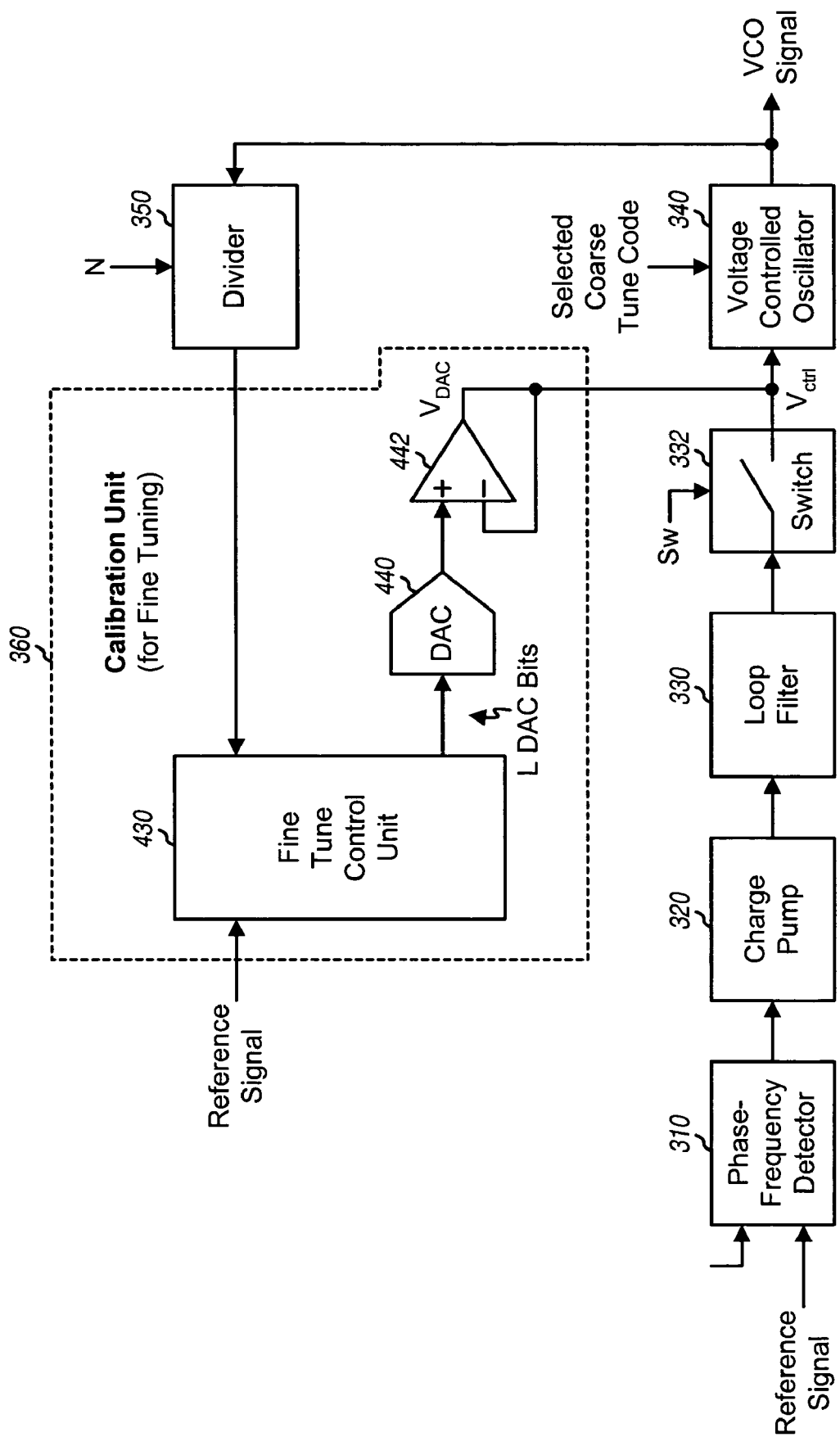
FIG. 6 shows the circuit blocks used for fine tuning.

FIG. 6 shows a block diagram of the circuit blocks within calibration unit 360 that are used for fine tuning. Divider 350 is programmed with the proper N divider value as described above. Fine tune control unit 430 opens switch 332 so that loop filter 330 does not drive VCO 340.

In an embodiment, fine tune control unit 430 performs a binary search to find the $V_{init}$ voltage for the desired VCO frequency. For the binary search, fine tune control unit 430 initially sets the L bits of DAC 440 to an initial value of $2^{L-1}$, or '100 . . . 0', so that the MSB is set to '1' and the (L−1) remaining DAC bits are each set to '0'. Fine tune control unit 430 then toggles one DAC bit at a time, starting with the next most significant DAC bit. A different DAC value is formed each time a DAC bit is toggled. DAC 440 receives each DAC value from fine tune control unit 430 and generates a corresponding DAC voltage. Buffer 442 buffers the DAC voltage and provides the $V_{DAC}$ voltage to the input of VCO 340.

If VCO 340 has a negative VCO gain, which is assumed to be the case in the description herein, then a higher control voltage corresponds to a lower VCO frequency. For the lowest DAC value of all zeros, which corresponds to the lowest control voltage, the $f_{div}$ frequency of the divided VCO signal is the highest possible. For each DAC bit y that is toggled from '0' to '1', fine tune control unit 430 receives and compares the $f_{div}$ frequency of the divided VCO signal against the $f_{ref}$ frequency of the reference signal. If the $f_{div}$ frequency is higher than the $f_{ref}$ frequency, then DAC bit y is kept at the new value of '1', and the next lesser significant DAC bit is toggled. Otherwise, DAC bit y is reset to the original value of '0', and the next lesser significant DAC bit is toggled. After all L DAC bits have been toggled and set/reset as described above, the L-bit fine tune code for the desired VCO frequency is equal to the final values of the L DAC bits. The DAC voltage generated by this fine tune code is the initial control voltage $V_{init}$.

VCO 340 (as well as most VCOs) provides a VCO frequency that is not a linear function of the control voltage $V_{ctrl}$. The control voltage adjusts the gate voltage of the varactor, which in turn adjusts the varactor capacitance, which then varies the VCO frequency. Any of these phenomena may cause the VCO frequency to be a non-linear function of the control voltage, where "non-linear" is used to mean not linear. The VCO frequency may be plotted versus the control voltage to obtain a gain transfer function for the VCO. The VCO gain is defined as a delta change in the VCO frequency due to a delta change in the control voltage. The VCO gain is thus equal to the slope of the gain transfer function. Different VCO gains are obtained for different control voltages for a non-linear VCO gain transfer function.

The closed-loop characteristics of PLL 300 may be given in terms of a natural frequency $\omega_n$ and a damping factor $\zeta$; The natural frequency $\omega_n$ is closely related to the closed-loop bandwidth of the PLL. The damping factor $\zeta$ indicates the amount of overshoot (if any) in the closed-loop response of the PLL. The natural frequency $\omega_n$ and the damping factor $\zeta$ affect the acquisition and tracking performance of the PLL and are typically designed for a specific application (e.g., wireless communication) to achieve the desired performance. The natural frequency $\omega_n$ and the damping factor $\zeta$ are dependent on the gains of all of the circuit blocks within the close loop of the PLL. These circuit blocks include VCO 340, phase-frequency detector 310, and charge pump 320. The VCO frequency drifts with temperature, power supply, and other factors during normal operation, and the control voltage drifts correspondingly to maintain phase/frequency lock. If the VCO gain changes due to the drift in the control voltage, then the closed-loop characteristics of the PLL also change.

To maintain similar PLL closed-loop characteristics over the entire range of control voltages, the VCO gain may be measured for different control voltages during calibration. Thereafter, for any given control voltage being applied to VCO 340, the VCO gain at that control voltage may be ascertained and compensated by adjusting the gain of one or more other circuit blocks (e.g., charge pump 320) within the PLL to maintain the same overall loop gain. This constant overall loop gain then maintains the PLL closed-loop characteristics constant even if the VCO gain changes for different control voltages.

Figure 7:
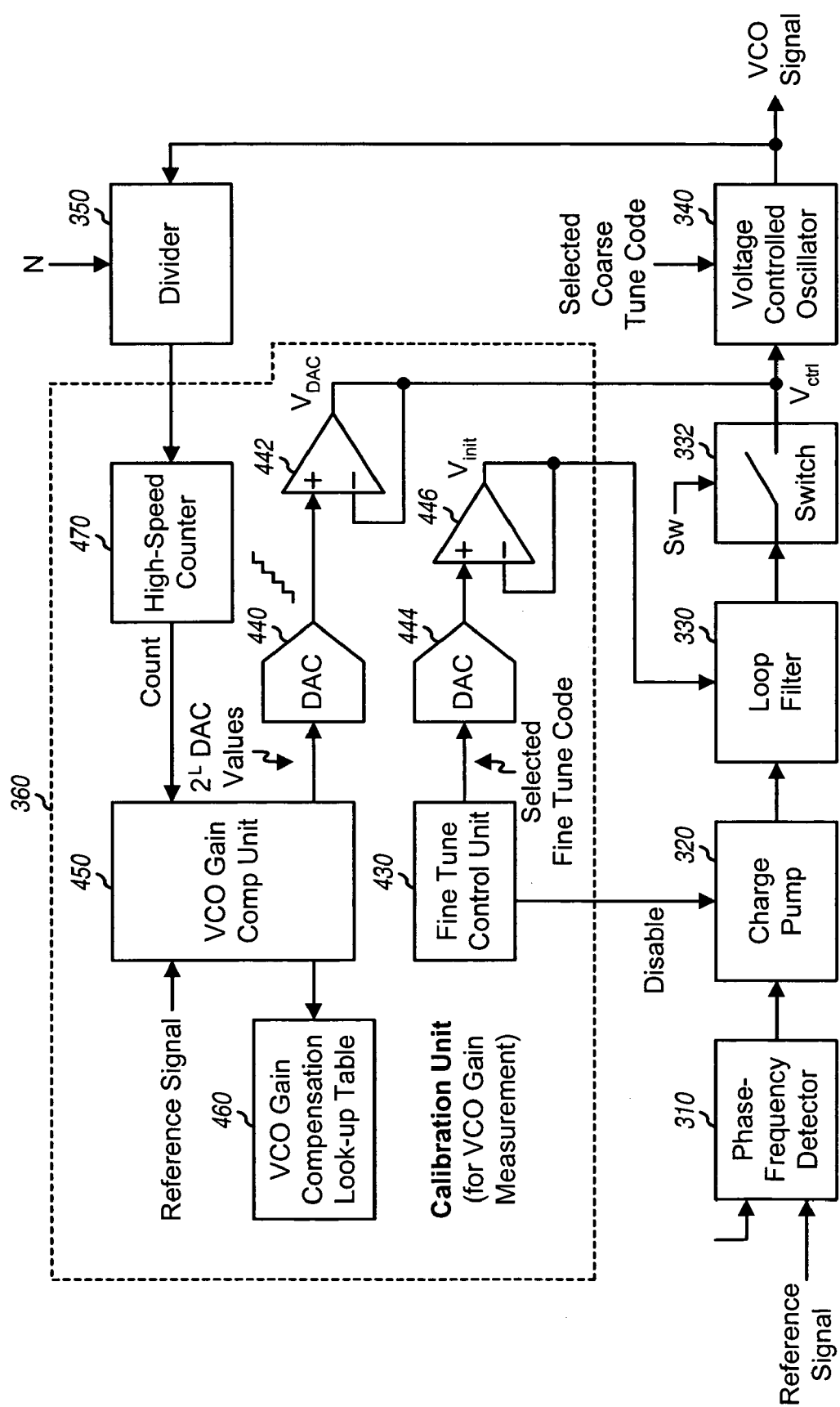
FIG. 7 shows the circuit blocks used for measuring the VCO gain.

FIG. 7 shows a block diagram of the circuit blocks within calibration unit 360 that are used for measuring the VCO gain. Divider 350 is programmed with the proper N divider value as described above. Control unit 410 opens switch 332 so that loop filter 330 does not drive VCO 340.

VCO gain compensation unit 450 then linearly steps through the $2^L$ DAC values and provides one DAC value at a time, starting with the lowest DAC value of all zeros. DAC 440 receives each DAC value from VCO gain compensation unit 450 and generates the corresponding DAC voltage. Buffer 442 buffers the DAC voltage and provides the $V_{DAC}$ voltage to the input of VCO 340. For each DAC value, high-speed counter 470 receives the divided VCO signal from divider 350 and counts the number of cycles of the divided VCO signal in a measurement window of $T_{count}$. For VCO 340 with a negative VCO gain, lower count values are obtained from counter 470 for progressively higher DAC values. For each DAC value y except the lowest DAC value, i.e., for y=1, 2, 3, . . . , ($2^L$–1), the count value for that DAC value y is subtracted from the count value for the prior DAC value y–1 to obtain a count offset/delta (ΔCount) for DAC value y. This count offset is related to the VCO gain, as follows:

$$\text{Count} = f_{div} \times T_{count}, \quad \text{Eq (2)}$$

$$\begin{aligned}\Delta\text{Count} =& \\ \Delta f_{div} \times T_{count} =& K_V \times \Delta V_{ctrl} \times T_{count} = K_V \times V_{DAC\_step} \times T_{count}, \text{ and}\end{aligned} \quad \text{Eq (3)}$$

$$K_V = \frac{\Delta\text{Count}}{T_{count} \times V_{DAC\_step}}, \quad \text{Eq (4)}$$

where Count is the count value from high-speed counter 470 for DAC value y;
ΔCount is the difference in the count values for DAC values y and y–1;
$\Delta f_{div}$ is the difference in the divided VCO frequencies for DAC values y and y–1;
$\Delta V_{ctrl}$ is the difference in the control voltages for DAC values y and y–1; and
$V_{DAC\_step}$ is the difference in the DAC output voltages for a change of one least significant bit.

The VCO gain $K_V$ for each non-zero DAC value (i.e., each DAC value except for the lowest DAC value) is computed as described above. A VCO gain compensation value is then derived for each DAC value. Up to $2^L$ VCO gain compensation values may be derived and stored in look-up table 460 for the $2^L$ DAC values. The VCO gain compensation values may be given in various forms. For example, the VCO gain compensation values may be (1) the measured VCO gains, e.g., as computed in equation (4), (2) the inverses of the measured VCO gains, (3) gain adjustments for another circuit block (e.g., charge pump 320) to achieve approximately constant overall gain, or (4) some other values. For example, charge pump 320 may be designed with up to $2^L$ different gain settings, and look-up table 460 may store the specific gain setting to use for charge pump 320 for each of the different VCO control voltage ranges, where each control voltage range corresponds to one DAC step. The VCO gain compensation values would then include the VCO gain function of VCO 340 as well as the gain transfer function of charge pump.

To reduce acquisition time for PLL 300, it is desirable to pre-charge loop filter 330 to be as close as possible to the initial control voltage $V_{init}$ when the calibration tasks are finished. Loop filter 330 typically includes a relatively large capacitor that may take a long time to charge. Thus, while the VCO control line is being charged for coarse tuning, fine tuning, and/or VCO gain measurement, control unit 410 can provide to DAC 444 one or more DAC values that put VCO 340 close to the desired operating frequency as possible. Buffer 446 buffers the output of DAC 444 and provides the buffered voltage to loop filter 330. While loop filter 330 is being pre-charged, charge pump 320 is disabled so that the $I_{CP}$ current does not adversely affect the pre-charging. Depending on the amount of time needed to pre-charge loop filter 300, loop filter 330 may be pre-charged in multiple stages, e.g., first to an arbitrary initial voltage $V_{arb}$ during the coarse and fine tuning and then to the $V_{init}$ voltage during the VCO gain measurement. In any case, after loop filter 330 has been pre-charged, DAC 444 and/or buffer 446 are disabled, and the pre-charge voltage is stored by the capacitor within loop filter 330.

For the embodiment shown in FIGS. 4 through 7, two DACs 440 and 444 are used to charge the VCO control line and to pre-charge loop filter 330, respectively. Switch 332 dissociates the loop filter and the VCO control line. This allows DAC 444 to pre-charge loop filter 320 while DAC 440 quickly charges the VCO control line in order to perform the coarse tuning, fine tuning, and VCO gain measurement as fast as possible.

During coarse tuning, switch 332 is open and DAC 444 pre-charges loop filter 330 to the arbitrary initial voltage $V_{arb}$ (not shown in FIG. 5 for simplicity). This $V_{arb}$ voltage may be, for example, $V_{arb}=(V_{lpf\_min}+V_{lpf\_max})/2$, where $V_{lpf\_min}$ is the minimum allowable voltage and $V_{lpf\_max}$ is the maximum allowable voltage for loop filter 330. At the same time, DAC 440 charges the VCO control line to the desired CTAT voltage to commence coarse tuning. During fine tuning, switch 332 is open and DAC 444 continues to pre-charge loop filter 330 to the $V_{arb}$ value (not shown in FIG. 6 for simplicity). At the same time, DAC 440 charges the VCO control line for a binary search to determine the $V_{init}$ voltage. Once the $V_{init}$ voltage is known, DAC 444 pre-charges loop filter 330 to this $V_{init}$ voltage.

During VCO gain measurement, switch 332 is open and DAC 444 continues to pre-charge loop filter 330 to the $V_{init}$ voltage. At the same time, DAC 440 charges the VCO control line to different DAC steps to measure the gain of the VCO at each DAC step. Once the VCO gain measurement is completed, the entire PLL is reset and switch 332 is closed so that the PLL is phase and frequency locked. Frequency lock is ensured by pre-charging loop filter 330 to the $V_{init}$ voltage. Phase lock is ensured by applying a reset pulse to pertinent circuit blocks within the PLL (e.g., to reset the counter in divider 350). The reset pulse is synchronized with the reference frequency. If the delay of the reset pulse is known, then this delay may be calibrated out. This resetting of the PLL reduces the initial phase error hence decreases the lock time.

In another embodiment, the PLL in FIG. 12 includes all of the elements shown in FIG. 4 except DAC 440, buffer 442, and switch 332. In a low noise application, switch 332 can add unwanted noise into the PLL. This embodiment includes one DAC 444 and a high current buffer. The current buffer couples to DAC 444 and is capable of charging loop filter 330 quickly. During coarse tuning, the DAC charges both loop filter 330 and the VCO control line to the desired CTAT voltage to facilitate coarse tuning. During fine tuning, the DAC charges both loop filter 330 and the VCO control line for a binary search to determine the $V_{init}$ voltage. The fine tune DAC value corresponding to this $V_{init}$ voltage is stored in memory. During VCO gain measurement, the DAC charges both loop filter 330 and the VCO control line to different DAC steps to measure the gain of the VCO at each DAC step. Once the VCO gain measurement is completed, the DAC charges loop filter 330 and the VCO control voltage to the predetermined fine tune DAC value and the entire PLL is reset with a reset pulse. Frequency lock is ensured by pre-charging loop filter 330 to the $V_{init}$ voltage, and phase lock is ensured by applying the reset pulse.

Figure 8:
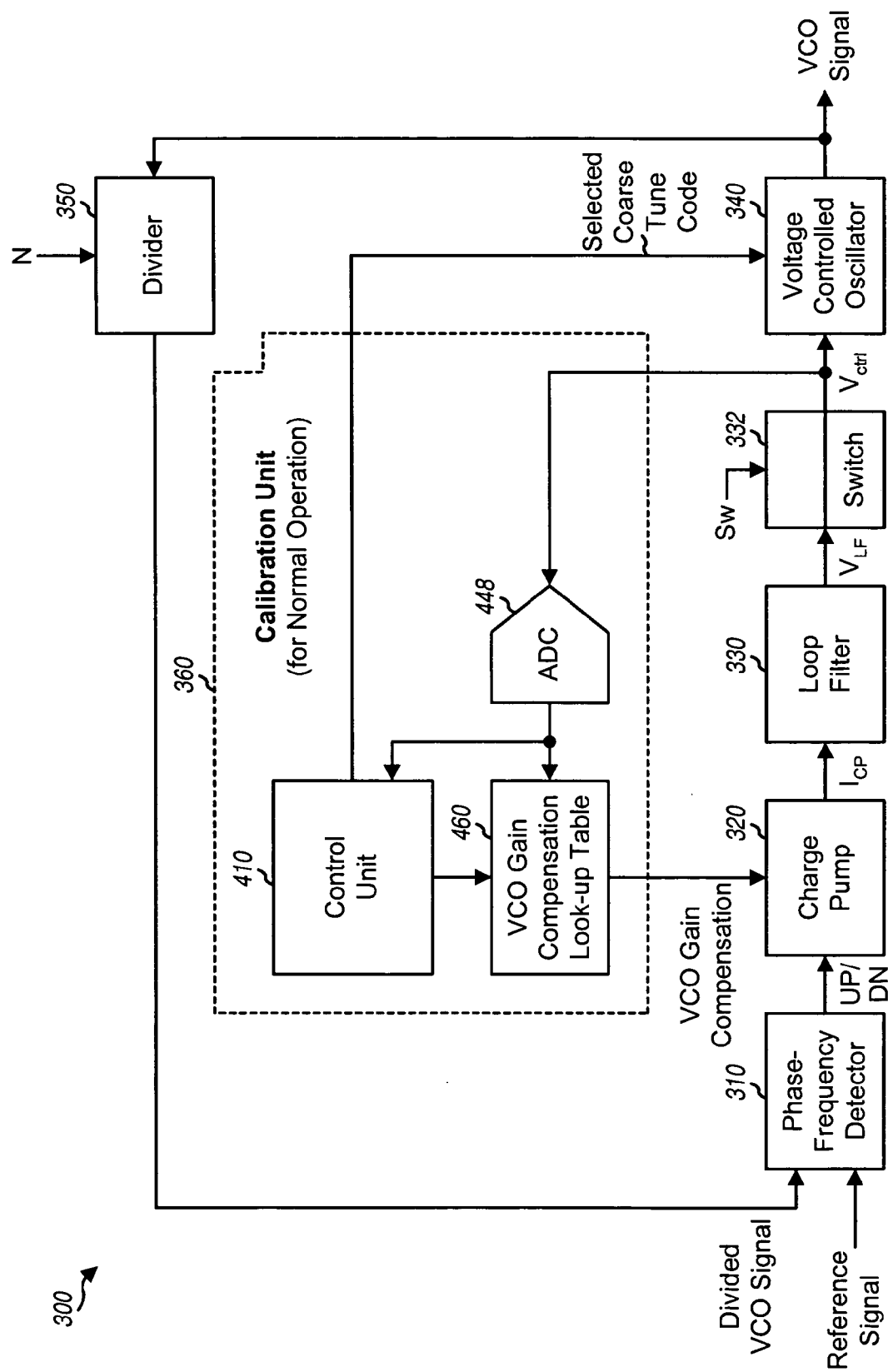
FIG. 8 shows the circuit blocks used for normal operation of the PLL.

FIG. 8 shows a block diagram of the circuit blocks within calibration unit 360 that are used during normal operation of the PLL. Divider 350 is programmed with the proper N divider value as described above. Control unit 410 closes switch 332 so that loop filter 330 drives VCO 340. Normal operation commences after calibration is completed and includes an acquisition phase and a tracking phase.

In the acquisition phase, the PLL locks the VCO signal to the reference signal. Loop filter 330 is initially pre-charged to the $V_{init}$ voltage, which is close to the final control voltage that provides the desired VCO frequency. By pre-charging loop filter 330 close to the final control voltage, the acquisition/lock time for the PLL may be substantially shortened. Although not shown in FIG. 8 for simplicity, a ramp voltage may also be added to loop filter 330 to further speed up locking. In any case, the PLL loop dynamics then lock the VCO signal to the reference signal.

In the tracking phase, the PLL adjusts the frequency/phase of the VCO to match the frequency/phase of the reference signal. VCO 340 may drift during normal operation due to variations in temperature, power supply, and so on. As VCO 340 drifts, different control voltages may be needed to obtain the same desired VCO frequency. Different control voltages may correspond to different VCO gains, which alter the loop dynamics. To retain the desired loop dynamics, the overall gain of the PLL is maintained approximately constant even if the control voltage drifts. This is achieved by digitizing the control voltage with ADC 448, and providing the digitized value to look-up table 460, which then provides the proper compensation value for the VCO gain corresponding to the current control voltage. For example, if the VCO gain varies by a factor of g, then the gain of charge pump 320 may be varied by a factor of 1/g to maintain the same overall gain.

Control unit 410 may monitor the digitized control voltage from ADC 448 to determine whether the PLL is locked. Control unit 410 may adjust the fine tune DAC value such that VCO control voltage is maintained within a predetermined range. If the selected fine tune DAC value is out of bounds, then control unit 410 modifies the coarse tune DAC value accordingly until the fine tune DAC value is within an allowable locking range. This interaction between the fine tune DAC value and coarse tune DAC value is not shown in the above figures for simplicity.

FIG. 9 shows a flow diagram of a process 900 for calibrating and operating PLL 300. Coarse tuning is first performed to select a frequency range from among multiple frequency ranges for the VCO (block 912). The VCO may include one or more capacitors that may be selectively enabled and disabled to obtain the multiple frequency ranges for the VCO. Each frequency range may correspond to a different combination of capacitors that are enabled. The selected frequency range covers the desired operating frequency. The coarse tuning may be performed with a binary search through M code bits that define the multiple frequency ranges. The coarse tuning may also be performed with a reference voltage that is complementary to absolute temperature to remove the effect of temperature from the coarse tuning, as described above. The VCO is thereafter operated in the selected frequency range.

Fine tuning is then performed to determine the initial control voltage for the desired operating frequency (block 914). This may be achieved by performing a binary search through the L bits of the DAC used to generate the control voltage for the VCO. The initial control voltage is close to the final control voltage needed to operate the VCO at the desired frequency.

The VCO gain is measured for different control voltages by stepping the DAC through different DAC values and measuring the frequency of the VCO signal for each DAC value, e.g., by counting the number of cycles in the divided VCO signal in a measurement window (block 916). VCO gain compensation values are also derived for different DAC values based on the frequency measurements (also block 916).

To lock the VCO for normal operation, the loop filter is pre-charged (or set) to the initial control voltage determined by the fine tuning (block 918). A reset pulse is applied to reset the PLL (e.g., divider 350) to reduce the initial phase error and hence decrease the lock time (block 920). The loop filter is then enabled to lock the VCO to the desired operating frequency, starting from the initial control voltage (block 922). VCO gain compensation is performed during normal operation, after the PLL is locked, to maintain the desired closed-loop response for the PLL (block 924).

FIG. 10 shows a flow diagram of an embodiment of block 924 for performing VCO gain compensation during normal PLL operation. For VCO gain compensation, the control voltage for the VCO is measured, e.g., with an ADC (block 1012). The VCO gain compensation value for the measured control voltage is then obtained, e.g., from the look-up table (block 1014). The gain of at least one circuit block (e.g., charge pump 320) within the PLL is then adjusted to compensate for the gain of the VCO (block 1016). The VCO gain compensation maintains an approximately constant overall gain for the PLL, which in turn maintains the desired closed-loop response for the PLL.

Figure 11:
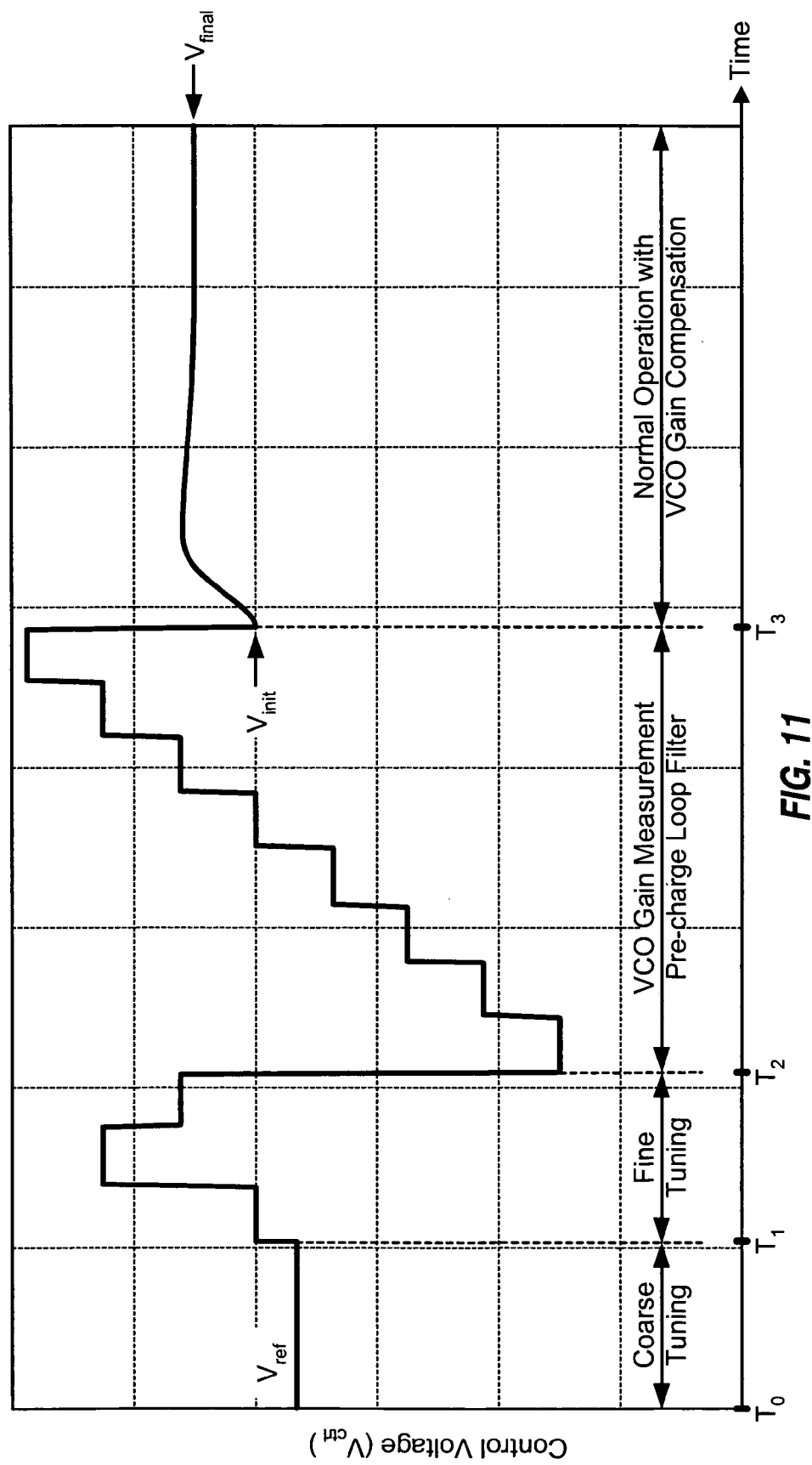
FIG. 11 shows a plot of the control voltage during a PLL locking procedure.

FIG. 11 shows an exemplary plot of the control voltage during a locking procedure for PLL 300. For this example, a 3-bit DAC is used for fine tuning and VCO gain measurement. Coarse tuning is performed starting at time $T_0$. The control voltage is maintained at the reference voltage $V_{ref}$ during the entire coarse tuning procedure. Fine tuning is performed starting at time $T_1$ to determine the initial control voltage for the VCO. The three bits of the DAC are stepped through, one DAC bit at a time starting with the MSB. In this example, a DAC value of 5 provides the initial control voltage that is close to the final control voltage. The VCO gain is measured starting at time $T_2$. The eight DAC values are stepped through, one DAC value at a time starting with the lowest DAC value, to measure the VCO gain at different control voltages. The loop filter is also pre-charged to the $V_{init}$ voltage starting at time $T_2$. After completion of the calibration tasks, acquisition commences at time $T_3$. The loop filter is enabled and locks the VCO to the desired operating frequency. The control voltage moves from the initial control voltage $V_{init}$ to the final control voltage $V_{final}$ in a shorter time because the $V_{init}$ voltage is close to the $V_{final}$ voltage.

The coarse tuning, fine tuning, and VCO gain measurement may be performed in various manners and at various times. For example, all three calibration tasks may be performed whenever wireless device 100 is powered up, whenever the VCO is powered on, whenever the wireless device attempts to acquire a new system, whenever a new frequency band or RF channel is selected (e.g., for a handoff with another system), whenever a new coarse tune code is selected (e.g., because of drift due to temperature and/or power supply), and so on. Coarse tuning may be performed, whenever the VCO needs to be operated at a different frequency range. Fine tuning may be performed whenever coarse tuning is performed in order to obtain an accurate initial control voltage for the selected frequency range. The VCO gain may also be measured whenever coarse tuning is performed in order to obtain an accurate characterization of the VCO gain for the selected frequency range. Fine tuning may be performed before VCO gain measurement so that the loop filter may be pre-charged during the VCO gain measurement.

For clarity, the calibration and operation of the PLL have been described for a VCO. The calibration and operation techniques described herein may also be applied to other types of adjustable oscillator such as a current controlled oscillator (ICO).

The PLL described herein may be used for various systems and applications. For example, the PLL may be used for wireless communication systems such as cellular systems, OFDM systems, orthogonal frequency division multiple access (OFDMA) systems, multiple-input multiple-output (MIMO) systems, wireless local area networks (WLANs), and so on. The cellular systems include Code Division Multiple Access (CDMA) systems, Global System for Mobile Communications (GSM) systems, and so on. The CDMA systems include IS-95, IS-2000, IS-856, and Wideband-CDMA (W-CDMA) systems. The PLL may be used for a wireless device as well as a base station. For a time division duplexed (TDD) system that transmits and receives at different times, such as a GSM system or an IEEE 802.11 system, one PLL may be used for both the transmit and receive paths. For a frequency division duplexed (FDD) system that transmits and receives at the same time on different frequency bands, such as a CDMA system, one PLL may be used for the transmit path and another PLL may be used for the receive path. In any case, each PLL may be implemented and operated as described above.

The PLL described herein may be implemented in various manners. For example, all or many of the circuit blocks for the PLL may be implemented within an integrated circuit (IC), an RF integrated circuit (RFIC), an application specific integrated circuit (ASIC), and so on. The PLL may also be implemented with a combination of one or more ICs, discrete components, and so on. For example, phase-frequency detector 310, charge pump 320, loop filter 330, switch 332, VCO 340, and calibration unit 360 may all be implemented on an RFIC. Alternatively, calibration unit 360 may be implemented on an ASIC and the remaining circuit blocks may be implemented on an analog IC. The PLL may also be fabricated with various IC process technologies such as complementary metal oxide semiconductor (CMOS), bipolar junction transistor (BJT), bipolar-CMOS (BiC-MOS), silicon germanium (SiGe), gallium arsenide (GaAs), and so on.

The various control units for the PLL (e.g., control unit 410, coarse tune control unit 420, fine tune control unit 430, and VCO gain compensation 450) may be implemented in various manners. For example, each control unit may be implemented with a state machine that performs the required functions and generates the required controls. The control units may also be implemented with a controller, microcontroller, a processor, a microprocessor, and so on. For example, the various control units may be implemented with different software modules executed by a processor (e.g., DSP 110 in FIG. 1).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
   a voltage controlled oscillator (VCO);
   a loop filter operative to provide a control voltage to lock the VCO to a desired operating frequency; and
   a calibration unit operative to determine an initial control voltage for the desired operating frequency and to pre-charge the loop filter to the initial control voltage, wherein the calibration unit is operative to perform a binary serach across L bits to determine the initial control voltage, where L is greater than one and the L bits define a plurality of control voltages being evaluated.

2. The apparatus of claim 1, wherein the calibration unit is operative to evaluate a plurality of control voltages, to ascertain a VCO frequency for each of the plurality of control voltages, and to determine the initial control voltage for the desired operating frequency based on VCO frequencies ascertained for the plurality of control voltages.

3. The apparatus of claim 2, further comprising:
   a digital-to-analog converter (DAC) operative to receive a plurality of DAC values and generate the plurality of control voltages, and wherein the initial control voltage is generated by one of the plurality of DAC values.

4. The apparatus of claim 1, wherein the calibration unit is further operative to measure VCO gain for a plurality of digital-to-analog converter (DAC) values.

5. The apparatus of claim 4, wherein the calibration unit is operative to pre-charge the loop filter while measuring VCO gain.

6. An integrated circuit comprising:
   a voltage controlled oscillator (VCO);
   a loop filter operative to provide a control voltage to lock the VCO to a desired operating frequency; and
   a calibration unit operative to determine an initial control voltage for the desired operating frequency and to pre-charge the loop filter to the initial control voltage, wherein the calibration unit is operative to perform a binary search across L bits to determine the initial control voltage, where L is greater than one and the L bits define a plurality of control voltages being evaluated.

7. An apparatus comprising:
a voltage controlled oscillator (VCO) having a plurality of frequency ranges;
a loop filter operative to provide a control voltage to lock the VCO to a desired operating frequency; and
a calibration unit operative to perform coarse tuning to select a frequency range from among the plurality of frequency ranges, to perform fine tuning to determine an initial control voltage for the desired operating frequency, and to provide the initial control voltage to the loop filter, wherein the selected frequency range covers the desired operating frequency.

8. The apparatus of claim 7, wherein the VCO comprises a plurality of capacitors that are selectively enabled and disabled to obtain the plurality of frequency ranges for the VCO.

9. The apparatus of claim 7, wherein the calibration unit is operative to evaluate a plurality of code values, to ascertain a VCO frequency for each of the plurality of code values, and to select the frequency range based on VCO frequencies ascertained for the plurality of code values, wherein each code value corresponds to a different frequency range for the VCO.

10. The apparatus of claim 7, wherein the calibration unit is operative to perform a binary search across M code bits to determine the frequency range covering the desired operating frequency, where M is greater than one and the M code bits define the plurality of frequency ranges for the VCO.

11. The apparatus of claim 7, further comprising:
a reference circuit operative to provide a reference current or a reference voltage used for the coarse tuning.

12. The apparatus of claim 7, further comprising:
a reference circuit operative to provide a reference current or a reference voltage that is complementary to absolute temperature (CTAT) and used for the coarse tuning.

13. The apparatus of claim 7, wherein the calibration unit is operative to perform a binary search across L bits to determine the initial control voltage, where L is greater than one and the L bits define a plurality of control voltages being evaluated.

14. The apparatus of claim 7, wherein the calibration unit is further operative to determine gain of the VCO for a plurality of control voltages and to derive a plurality of VCO gain compensation values for the plurality of control voltages.

15. The apparatus of claim 14, wherein the calibration unit comprises a look-up table operative to store the plurality of VCO gain compensation values.

16. The apparatus of claim 7, further comprising:
a charge pump having an adjustable gain and operative to provide an output current for the loop filter, wherein the calibration unit is operative to vary the adjustable gain of the charge pump to maintain a constant overall gain.

17. The apparatus of claim 14, wherein the loop filter is pre-charged with the initial control voltage while the gain of the VCO for the plurality of control voltages is determined.

18. The apparatus of claim 17, further comprising:
a first digital-to-analog converter (DAC) operative to receive a plurality of DAC values and generate the plurality of control voltages for determining the gain of the VCO; and
a second DAC operative to receive a selected DAC value and generate the initial control voltage for pre-charging the loop filter.

19. The apparatus of claim 7, wherein the VCO is operative to provide a local oscillator (LO) signal used for frequency upconversion to generate a radio frequency (RF) output signal.

20. The apparatus of claim 7, wherein the VCO is operative to provide a local oscillator (LO) signal used for frequency downconversion of a radio frequency (RF) input signal.

21. A method of controlling an oscillator in a phase-locked loop (PLL), comprising:
performing fine tuning to determine an initial control voltage to operate the oscillator near a desired operating frequency;
pre-charging a loop filter to the initial control voltage; and
enabling the loop filter to lock the oscillator to the desired operating frequency starting from the initial control voltage, wherein the performing fine tuning comprises performing a binary search across L bits to determine the initial control voltage, where L is greater than one and the L bits define a plurality of control voltages being evaluated, and wherein the initial control voltage is one of the plurality of control voltages evaluated.

22. The method of claim 21, further comprising:
determining gain of the oscillator for a plurality of control voltages; and
adjusting gain of at least one circuit block within the PLL to compensate for the gain of the oscillator.

23. The method of claim 21, further comprising:
adjusting gain of at least one circuit block within the PLL to maintain a constant overall gain for the PLL.

24. A method of controlling an oscillator in a phase-locked loop (PLL), comprising:
performing fine tuning to determine an initial control voltage to operate the oscillator near a desired operating frequency;
pre-charging a loop filter to the initial control voltage;
enabling the loop filter to lock the oscillator to the desired operating frequency starting from the initial control voltage; and
performing coarse tuning to select a frequency range from among a plurality of frequency ranges for the oscillator, the selected frequency range covering the desired operating frequency.

25. The method of claim 24, wherein the performing coarse tuning comprises
performing a binary search across M code bits to determine the frequency range covering the desired operating frequency, where M is greater than one and the M code bits define the plurality of frequency ranges for the oscillator.

26. An apparatus comprising:
a first control unit operative to perform coarse tuning to select a frequency range from among a plurality of frequency ranges for an oscillator, the selected frequency range covering a desired operating frequency;
a second control unit operative to perform fine tuning to determine an initial control voltage for the desired operating frequency; and
a third control unit operative to pre-charge a loop filter to the initial control voltage and to enable the loop filter to lock the oscillator to the desired operating frequency starting from the initial control voltage.

27. The apparatus of claim 26, wherein the third control unit is operative to reset a phase locked loop (PLL) with a reset pulse to reduce initial phase error.

28. The apparatus of claim 26, wherein the third control unit is operative to select a different frequency range for the oscillator if the initial control voltage from the second control unit is outside of a predetermined range.

29. An apparatus comprising:

means for performing coarse tuning to select a frequency range from among a plurality of frequency ranges for an oscillator, the selected frequency range covering a desired operating frequency;

means for performing fine tuning to determine an initial control voltage for the desired operating frequency;

means for pre-charging a loop filter to the initial control voltage; and means for enabling the loop filter to lock the oscillator to the desired operating frequency starting from the initial control voltage.

* * * * *